United States Patent [19]

Nakashiba

[11] Patent Number: 5,565,373
[45] Date of Patent: Oct. 15, 1996

[54] METHOD OF FABRICATING AN ISOLATION REGION IN A SEMICONDUCTOR DEVICE WITHOUT HEAT TREATMENT OF ACTIVE REGIONS

[75] Inventor: Yasutaka Nakashiba, Tokyo, Japan

[73] Assignee: NEC Corporation, Tokyo, Japan

[21] Appl. No.: 208,681

[22] Filed: Mar. 11, 1994

[30] Foreign Application Priority Data

Mar. 11, 1993 [JP] Japan ................................. 5-077699

[51] Int. Cl.$^6$ ........................... H01L 31/18; H01L 21/70; H01L 27/00
[52] U.S. Cl. .................................. 437/53; 437/3
[58] Field of Search .................... 437/3, 50, 51, 437/53; 257/222, 223

[56] References Cited

U.S. PATENT DOCUMENTS

| 4,895,520 | 1/1990 | Berg | 437/45 |
| 4,956,306 | 9/1990 | Fuller et al. | 437/34 |
| 5,385,849 | 1/1995 | Nakashiba | 437/3 |

FOREIGN PATENT DOCUMENTS

| 60-106142 | 6/1985 | Japan . |
| 2-304974 | 12/1990 | Japan . |

*Primary Examiner*—Mary Wilczewski
*Assistant Examiner*—Brian K. Dutton
*Attorney, Agent, or Firm*—Young & Thompson

[57] ABSTRACT

The present invention provides a novel method for fabricating an isolation region involved in a semiconductor device. An active region of a first conductivity type is selectively formed in a predetermined area in a semiconductor layer of a second conductivity type. A metal film over said active region is selectively formed without use of any heat treatment to prevent said active region from suffering any damage due to heat treatment. A selective ion-implantation of an impurity of the second conductivity type is carried out by use of said metal film as a mask to form an isolation region of a higher impurity concentration than an impurity concentration of said second conductivity type semiconductor layer.

26 Claims, 18 Drawing Sheets

METHOD OF FABRICATING AN ISOLATION REGION IN A SEMICONDUCTOR DEVICE WITHOUT HEAT TREATMENT OF ACTIVE REGIONS

FIELD OF THE INVENTION

The invention relates to a method of fabricating a semiconductor device, and more particularly to an isolation region involved in semiconductor devices such as a charge coupled device (a CCD device) and a CCD solid state imaging device.

BACKGROUND OF THE INVENTION

The semiconductor devices such as the charge coupled device (CCD) and the CCD solid state imaging device are very useful devices in the field of the semiconductor device. A possibility of realizing such device showing superior properties seems to depend upon the fabrication processes for the semiconductor devices. For that reason, the importance of developments in newly and useful fabrication processes for such devices would be considerable.

In conventional fabrication processes for such the devices, in order to prevent any decrement of the active region, a selective oxidation is accomplished to form a relatively thick silicon oxide film on an active region in the device so that the relatively thick silicon oxide film is used as a mask for ion-implantation to form an isolation region in the active region with use of the self-alignment technique. The above matters are disclosed in the Japanese laid-open patent applications 60-206142 and 2-404974. One of the typical and conventional fabrication method for the solid state imaging device including a charge transfer region, an opto-electro conversion region and an isolation region will be described with reference to FIGS. 1A to 1F.

With reference to FIG. 1A, an n-type semiconductor substrate 501 is prepared to be formed with a p-type well region 502 thereon. A silicon oxide film 503 having a thickness of approximately 40 nanometers is grown on a top surface of the p-type well region 502 and subsequently a silicon nitride film 504 having a thickness of approximately 220 nanometers is grown on a top surface of the silicon oxide film 503. A first photo-resist film is provided on an entire surface of the silicon nitride film 504 to be patterned for a formation of a first photo-resist pattern 520a. The silicon nitride film 504 is selectively removed by a plasma etching in which the first photo-resist pattern 520a is used as a mask.

With reference to FIG. 1B, the first photo-resist pattern 520a is completely removed, after which a second photo-resist pattern is provided on the top surface of the device so as to cover the remaining silicon nitride film 504. The second photo-resist film is patterned to be selectively removed so that a second photo-resist pattern 520b is formed in a predetermined area within which a charge transfer region will be provided. An ion-implantation of an n-type dopant into the p-type well region 502 is accomplished with use of both the second photo-resist pattern 520b and the remaining silicon nitride film 504. The thickness of the silicon oxide film 503 is so very thin as to enable the n-type dopant to penetrate through the silicon oxide film 503 and implanted into a predetermined upper portion of the p-type well region 502. Thus, an n-type region serving as an opto-electro conversion region 506 is selectively formed at the predetermined upper portion of the p-type well region neither covered by the remaining silicon nitride film 504 nor covered by the second photo-resist pattern 520b.

With reference to FIG. 1C, the second photo-resist pattern 520b is removed before a third photo-resist film is provided on the top surface of the device so as to cover the remaining silicon nitride film 504. The third photo-resist film is patterned to be selectively removed so that a third photo-resist pattern 520c is formed to overlay an area except in the opto-electro conversion region 506. An ion-implantation of an n-type dopant into the p-type well region 502 is accomplished with use of both the third photo-resist pattern 520c and the remaining silicon nitride film 504. An n-type region serving as a charge transfer region 507 is selectively formed at an exposed upper portion of the p-type well region 502 which is neither covered with the remaining silicon nitride film 504 nor covered by the third photo-resist pattern 520c.

With reference to FIG. 1D, the third photo-resist pattern 520c is removed. The entire surface of the device is subjected to a selective thermal oxidation wherein the remaining silicon nitride film 504 serves as a mask. Namely, an exposed portion of the silicon oxide film 503, which is not covered with the remaining silicon nitride film 504, is subjected to the selective thermal oxidation so that the exposed portion thereof is grown into a relatively thick silicon oxide film 508 which has a thickness of approximately 300 nanometers. Since the remaining silicon nitride film 504 serving as a mask overlay surface areas of the device except for any active regions, the relatively thick silicon oxide film 508 is provided over the active regions such as the opto-electro conversion region 506 and the charge transfer region 507.

After the selective thermal oxidation of silicon, the remaining silicon nitride film 504 is completely removed by wet etching. An ion-implantation of a p-type dopant such as boron is accomplished with use of the relatively thick silicon oxide film 508 as a mask. The relatively thick silicon oxide film 508 has such sufficient thickness as to serve as a mask while the relatively thin silicon oxide film 503 is so thin as to enable the p-type dopant to penetrate through the relatively thin silicon oxide film 503 and implanted into the upper portion of the p-type well region 502 except in the active regions such as the opto-electro conversion region 506 and the charge transfer region 507. The above ion-implantation of the p-type dopant forms by self-alignment technique a p-type signal read region 510 having a higher dopant concentration than a dopant concentration of the p-type well region 502. A threshold value of the p-type signal read region 510 is controlled by the ion-implantation of the p-type dopant.

A fourth photo-resist film is provided on an entire top surface of the device to cover the relatively thick and thin silicon oxide films 508 and 503. The fourth photo-resist film is patterned to be made into a fourth photo-resist pattern 520d which exists only over the p-type signal read region 510 and its peripheral region. Then, neither part of the relatively thin silicon oxide film 503 nor all part of the relatively thick silicon oxide film 508 is covered by the fourth photo-resist pattern 520d. An additional ion-implantation of a p-type dopant such as boron is accomplished in which both the fourth photo-resist pattern 520d and the relatively thick silicon oxide film 508 serve as masks. The p-type dopant penetrates through the relatively thin silicon oxide film 503 which is not covered by the fourth photo-resist pattern 520d and implanted into the upper portion of the p-type well region 502 except both in the p-type signal read region 510 and in the active regions such as the opto-electro conversion region 506 and the charge transfer region 507. The above additional ion-implantation of the p-type dopant forms by self-alignment technique a p$^+$-isolation region 511 having a higher dopant concentration than dopant concentrations of the p-type well region 502 and the p-type signal read region 510. The p$^+$-isolation region 511 is provided to isolate the opto-electro conversion region 506 from the charge transfer region 507.

With reference to FIG. 1E, the fourth photo-resist pattern 520d as well as the relatively thin and thick silicon oxide films 503 and 508 are removed before a thermal oxidation is accomplished to form a first gate oxide film which is not illustrated. Subsequently, a first charge transfer electrode which is not illustrated is formed by use of a low pressure chemical vapor deposition method, a photo-lithography method and a plasma etching method. The first charge transfer electrode serves to conduct the charge transfer. The first gate oxide film is selectively removed by an etching in which the first charge transfer electrode is used as a mask, provided that none of the second charge transfer electrode 531 exists over the opto-electro conversion region 506. An additional thermal oxidation is accomplished to form a second gate oxide film 530 on an entire top surface of the device. Subsequently, a second charge transfer electrode 531 is formed by use of the low pressure chemical vapor deposition method, the photo-lithography method and the plasma etching method. The second charge transfer electrode serves to conduct both a read operation of a signal charge and a charge transfer from the opto-electro conversion region 506 to the charge transfer region 507. A further ion-implantation of a p-type dopant such as boron is accomplished with use of the charge transfer electrode 531 as a mask to form a p$^+$-type shallow region 512 over the opto-electro conversion region 506. The gate oxide film 530 is so thin as to enable the p-type dopant to penetrate through the second gate oxide film 530 and implanted into an upper portion of the n-type opto-electro conversion region 506. In this further ion-implantation, the p-type dopant is implanted at such an energy that the p-type dopant is limited to the shallow upper portion of the n-type opto-electro conversion region 506. The above further ion-implantation is continued until the shallow upper portion of the n-type opto-electro conversion region 506 is made into the p$^+$-type shallow region 512.

With reference to FIG. 1F, an inter-layer insulator 532 is deposited to cover both the charge transfer electrode 531 and an exposed portion of the second gate oxide film 530. A contact hole which is not illustrated is formed in the inter-layer insulator so that a part of the charge transfer electrode 531 is exposed through the contact hole. A metal film 533 to serve not only as a wiring but also as a photo mask is selectively formed on part of the inter-layer insulator 532 over the charge transfer electrode 531. A protective silicon oxide film 534 is formed on an entire surface of the device to cover both the metal film 533 and an exposed surface of the inter-layer insulator 532 thereby the conventional fabrication processes for the solid state imaging device are completed.

As described above, in the conventional fabrication method of the solid state imaging device, the relatively thick silicon oxide film is selectively formed by a selective thermal oxidation over the active regions such as the opto-electro conversion region 506 and the charge transfer region 507 so that the relatively thick silicon oxide film is able to serve as a mask for the ion-implantation of the p-type dopant to form by self-alignment technique the p$^+$-type isolation region between the opto-electro conversion region 506 and the charge transfer region 507.

Such the conventional fabrication method of the semiconductor device is unavoidably engaged with the following serious problems. The upper portions of the active regions such as the opto-electro conversion region and the charge transfer region are subjected to the selective thermal oxidation. First, this causes a dislocation loop in silicon crystal structure of the upper portion of the active region. The dislocation loop provides an disarrangement of silicon atoms and thus provides an imperfection of crystal or lattice structure of silicon. Second, this further causes both capturing a dopant of the active region into the silicon oxide film and a pile up phenomenon namely accumulating the dopant thereof on a surface of the active region without any capturing into the silicon oxide film. This causes a variation in an impurity concentration profile. The appearance of the dislocation loop and the variation of the impurity concentration profile provide inferiorities in device performances or properties.

In the conventional fabrication method, the p$^+$-type isolation region is so formed as to be in contact with the n-type active region. Thus heat treatment for example the thermal oxidation after forming the isolation region causes a lateral diffusion of the p-type impurity in the p$^+$-type isolation region. Namely, the p-type impurity is moved into the n-type active regions since the p$^+$-type isolation region has a higher impurity concentration than an impurity concentration of the n-type active region. This provides a decrement of the active regions such as the opto-electro conversion region and the charge transfer region thereby resulting in an inferiorities of the device performances or properties.

In the prior arts, the above problems would be unavoidable when the active region has suffered the damage due to any heat treatment such as a selective thermal oxidation of silicon. It would therefore be required to develop a novel and useful fabrication method for the above device free from any of the above problems.

SUMMARY OF THE INVENTION

Accordingly, it is a primary object of the present invention to provide a novel fabrication method for a semiconductor device free from the above problems.

It is a further object of the present invention to provide a novel fabrication method for an isolation region involved in a semiconductor device such as a solid state imaging device or a charge coupled device.

It is a further more object of the present invention to provide a novel fabrication method for an isolation region involved in a semiconductor device, which enable an active region to be free from any damage.

It is a still further object of the present invention to provide a novel fabrication method for an isolation region involved in a semiconductor device, which is free from the problem with an inferiority in device performances due to any appearance of a dislocation loop in an active region.

It is yet a further object of the present invention to provide a novel fabrication method for an isolation region involved in a semiconductor device, which is free from the problem with an inferiority in device performances due to any variation of an impurity profile in an active region.

It is an another object of the present invention to provide a novel fabrication method for an isolation region involved in a semiconductor device, which is free from the problem with an inferiority in device performances due to any lateral diffusion of an impurity in an isolation region having a high impurity concentration of one conductivity type into an active region of opposite conductivity type.

The above and other objects, features and advantages of the present invention will be apparent from the following descriptions.

The present invention provides a novel method for fabricating an isolation region involved in a semiconductor device. At least an active region of a first conductivity type is selectively formed in a predetermined area in a semiconductor layer of a second conductivity type. A metal film is selectively formed over the active region without subjecting the active region itself to any heat treatment such as a selective thermal oxidation of silicon as utilized in the conventional fabrication processes so as to prevent the active region from suffering any damage due to the heat treatment. A selective ion-implantation of an impurity of the second conductivity type is carried out by use of the metal film as a mask to form an isolation region of a higher impurity concentration rather than an impurity concentration of the second conductivity type semiconductor layer.

During the above fabrication method, the following fabrication steps may be involved. A thin silicon oxide film is formed on an entire surface of the second conductivity type semiconductor layer. A thin polycrystalline silicon film is formed on the thin silicon oxide film. A thick silicon oxide film is selectively formed on the polycrystalline silicon film so that the thick silicon oxide film is used as a mask for the ion-implantation of the impurity of the first conductivity type to form the active region and for subsequent formation of the metal film. The thick silicon oxide film is removed to carry out the selective ion-implantation of the impurity of the second conductivity type is carried out by use of the metal film as a mask to form the isolation region.

Through the above fabrication processes for forming the isolation region involved in the semiconductor device, the active region received none of any heat treatment nor any selective thermal oxidation of silicon so that the active region suffered none of damage due to any heat treatment. Contrary to the conventional fabrication method, the resultant active region prepared according to the present invention is free form any problems due to appearance of the dislocation loop in silicon crystal or lattice structure and further due to any variation of impurity profile of the active region.

Further, in the novel fabrication method according to the present invention, after the formation of the metal film, side walls may be formed at opposite sides of the metal film so that the side walls serve as masks together with the metal film for the ion-implantation to form the isolation region. As a result, the isolation region having a higher impurity concentration is provided to be separated from the active region so that the separation is able to prevent the impurity in the isolation region to be diffused by a lateral diffusion into the active region having the opposite conductivity type to the conductivity type of the isolation region. This is able to suppress any decrement of the active region due to the lateral diffusion of the impurity in the isolation region into the active region.

The present invention provides a novel method for fabricating a semiconductor device involving an isolation region. A thin silicon oxide film is formed on a semiconductor substrate of a first conductivity type. A polycrystalline silicon oxide film is formed on the thin silicon oxide film. A thick silicon oxide film is selectively formed on the polycrystalline silicon film. An active region is selectively formed by an ion-implantation of an impurity of a second conductivity type into the semiconductor substrate with use of the thick silicon oxide film as a mask. A metal film is selectively formed on the polycrystalline silicon film by a chemical vapor deposition with use of the thick silicon oxide film as a mask so that the metal film is positioned over the active region. The thick silicon oxide film is removed. A selective ion-implantation of an impurity of the first conductivity type is carried out by use of the metal film as a mask to form an isolation of a higher impurity concentration rather than an impurity concentration of the semiconductor substrate. The metal film, the polycrystalline silicon film and the thin silicon oxide film are sequentially removed. An insulation film having a through hole is formed on the active region and the isolation region. An electrode is formed on the insulation film in which the electrode is electrically coupled through the through hole to the active region.

During the above fabrication processes, the active region also received none of any heat treatment nor any selective thermal oxidation of silicon so that the active region suffered none of damage due to any heat treatment. The resultant active region is free from any problems due to appearance of the dislocation loop in silicon crystal or lattice structure and further due to any variation of impurity profile of the active region.

The present invention also provides another novel method for fabricating a semiconductor device involving an isolation region. A well region of a first conductivity type is formed on a semiconductor substrate of a second conductivity type. A thin silicon oxide film is formed on the well region. A polycrystalline silicon film is formed on the thin silicon oxide film. At least first and second active regions are selectively formed by an ion-implantation of an impurity of the second conductivity type with uses of the thick silicon oxide film and photo-resist pattern as masks. The photo-resist patterns are removed. A metal film is selectively formed on the polycrystalline silicon film by a chemical vapor deposition with use of the thick silicon oxide film as a mask so that the metal film is positioned over the active regions. The thick silicon oxide film is removed. A first selective ion-implantation of an impurity of the first conductivity type is carried out by use of the metal film as a mask to form regions of the first conductivity type having a higher impurity concentration rather than an impurity concentration of the well region. A photo-resist is selectively provided on the polycrystalline silicon film, except over a predetermined area in the first conductivity type regions. A second selective ion-implantation of an impurity of the first conductivity type is carried out by uses of both the metal film and the photo-resist pattern as masks to form an isolation region of the first conductivity type having a higher impurity concentration rather than an impurity concentration of the first conductivity type region. The photo-resist pattern, the metal film, the polycrystalline silicon film and the thin silicon oxide film are sequentially removed. An insulation film having a through hole is formed on the active regions, the first conductivity type region and the isolation region. An electrode is formed on the isolation film over at least one of the first and second active regions in which the electrode is electrically coupled through the through hole to the active region. An inter-layer insulator with an opening is formed on an entire surface of the device to cover at least the electrode. A metal layer is selectively formed on the inter-layer insulator in which the metal layer is electrically coupled through the opening to the electrode.

During the above fabrication processes, the active region also received none of any heat treatment nor any selective thermal oxidation of silicon so that the active region suffered none of damage due to any heat treatment. The resultant active region is free from any problems due to appearance of the dislocation loop in silicon crystal or lattice structure and further due to any variation of impurity profile of the active region.

Further, in the novel fabrication methods according to the present invention, after the formation of the metal film, side walls may be formed at opposite sides of the metal film so that the side walls serve as masks together with the metal film for the ion-implantation to form the isolation region. As a result, the isolation region having a higher impurity concentration is provided to be separated from the active region so that the separation is able to prevent the impurity in the isolation region to be diffused by a lateral diffusion into the active region having the opposite conductivity type to the conductivity type of the isolation region. This is able to suppress any decrement of the active region due to the lateral diffusion of the impurity in the isolation region into the active region.

BRIEF DESCRIPTION OF THE DRAWINGS

Preferred embodiments of the present invention will hereinafter fully be described in detail with reference to the accompanying drawings.

DESCRIPTION OF THE PREFERRED EMBODIMENTS

A first embodiment according to the present invention will be described with reference to FIGS. 2A to 2D. The first embodiment provides a novel fabrication method for a charge transfer device.

Figure 1A:
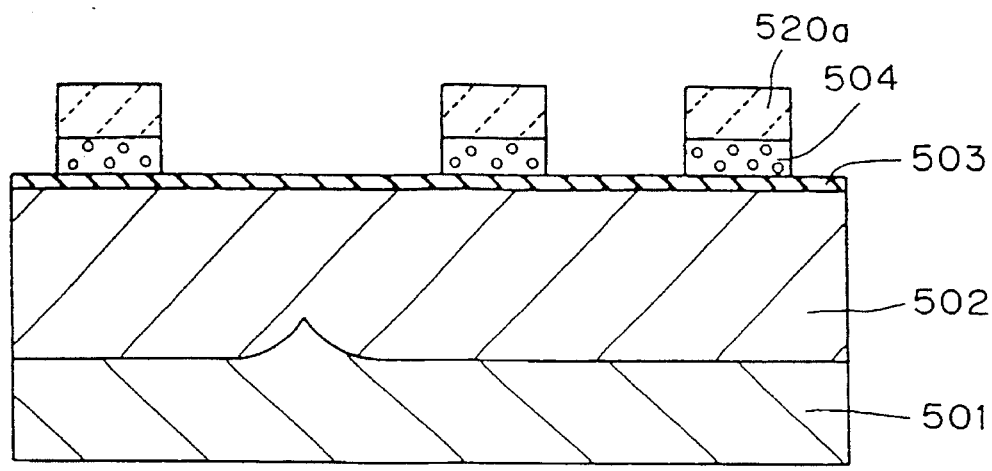
FIGS. 1A to 1F are fragmentary cross sectional elevation views illustrative of sequential steps involved in the conventional fabrication method of the solid state imaging device.
Figure 1B:
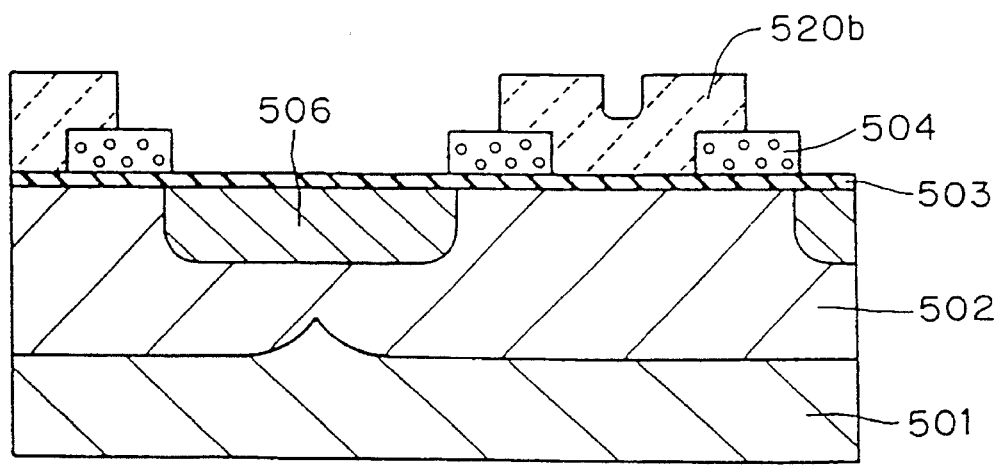
Figure 1C:
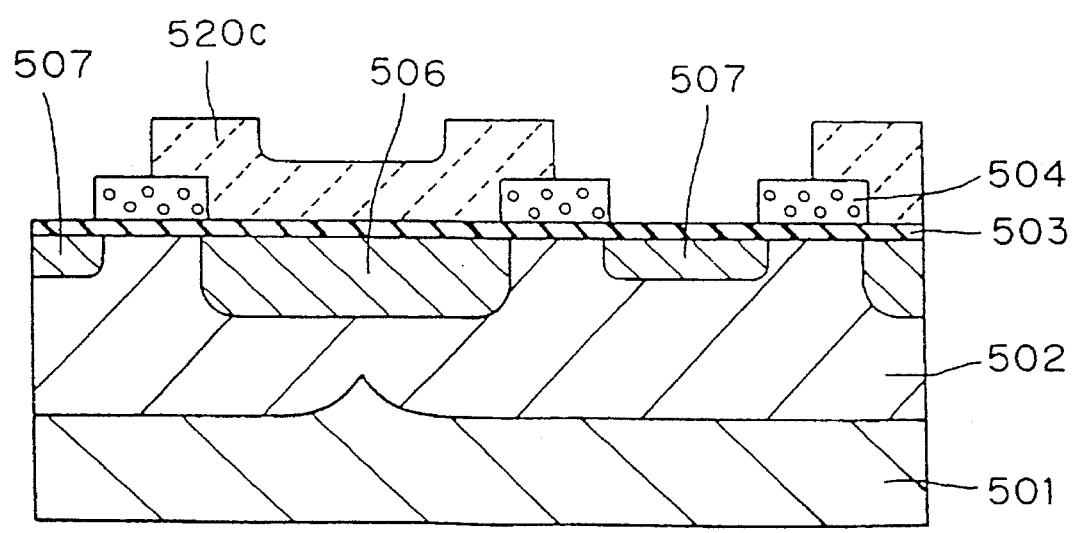
Figure 1D:
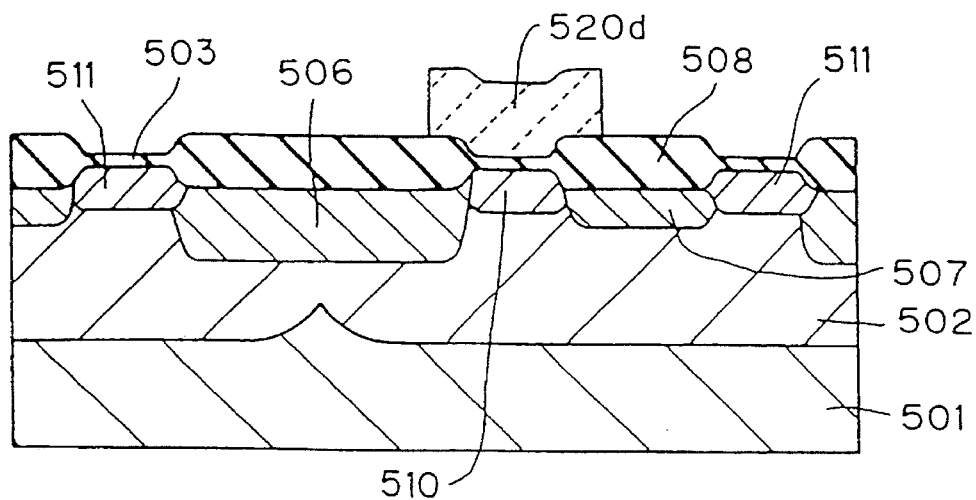
Figure 1E:
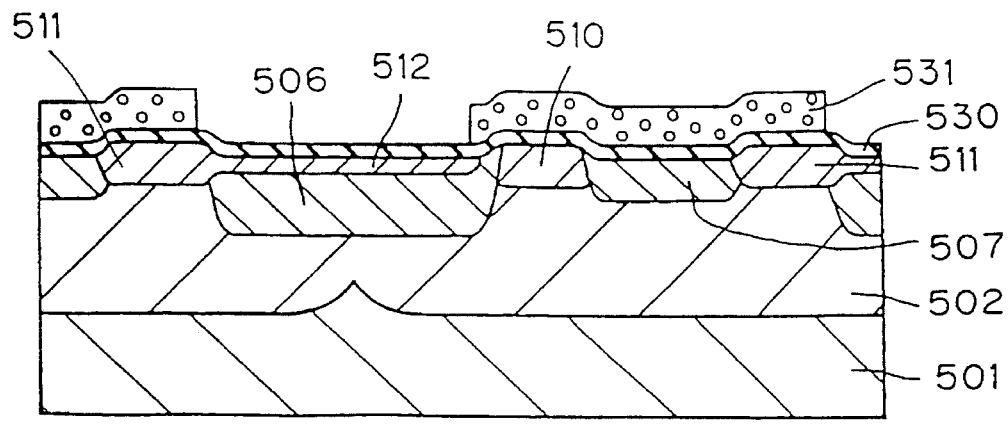
Figure 1F:
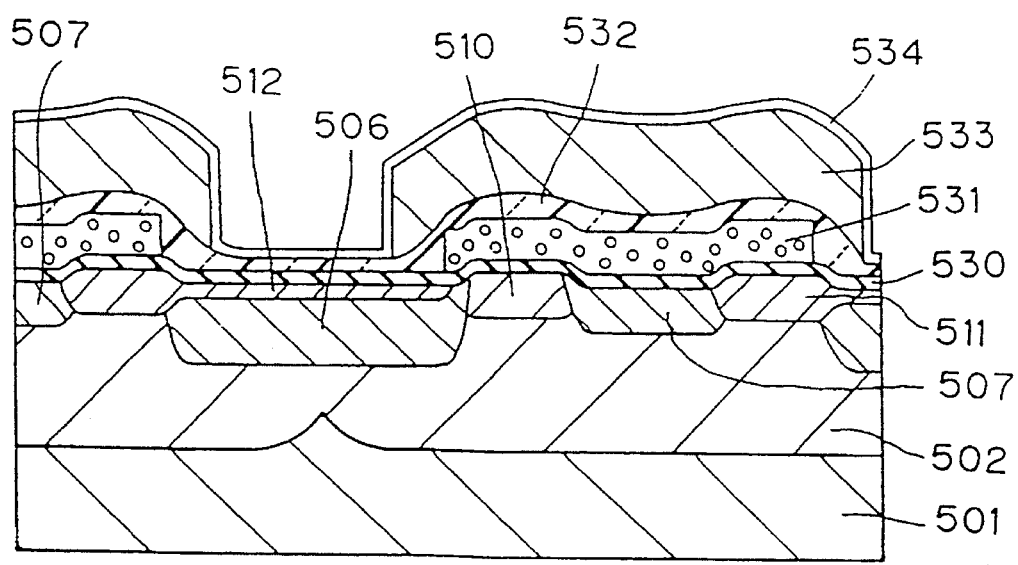
Figure 2A:
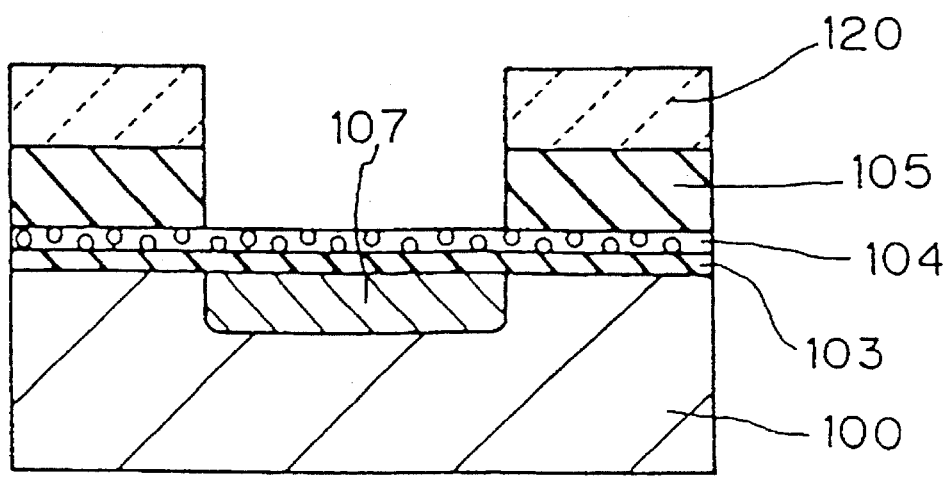
FIGS. 2A to 2D are fragmentary cross sectional elevation views illustrative of sequential steps involved in a novel fabrication method of a charge transfer device in a first embodiment according to the present invention.

With reference to FIG. 2A, a p-type semiconductor substrate 100 is prepared and then a thin silicon oxide film 103 having a thickness of approximately 20 nanometers is grown on a top surface of the p-type semiconductor substrate 100. A polycrystalline silicon film 104 having a thickness of approximately 100 nanometers is grown on a top surface of the thin silicon oxide film 103. A thick silicon oxide film 105 having a thickness of approximately 300 nanometers is grown on a top surface of the polycrystalline silicon film 104. A photo-resist film is provided on an entire top surface of the thick silicon oxide film 105. The photo-resist film is selectively removed to be made into a photo-resist pattern 120 serving as a mask. The thick silicon oxide film 105 is selectively removed by a plasma etching with use of the photo-resist pattern. The plasma etching is continued until a part of the polycrystalline silicon film 104 is exposed. An ion-implantation of an n-type dopant such as phosphorus is accomplished in which the photo-resist pattern 120 and the remaining thick silicon oxide film 105 serve as masks. The n-type dopant penetrates through the polycrystalline silicon film 104 and the thin silicon oxide film 103 and then implanted into an upper portion of the p-type semiconductor substrate 100 thereby an n-type charge transfer region is formed at the upper portion of the p-type semiconductor substrate 100.

Figure 2B:
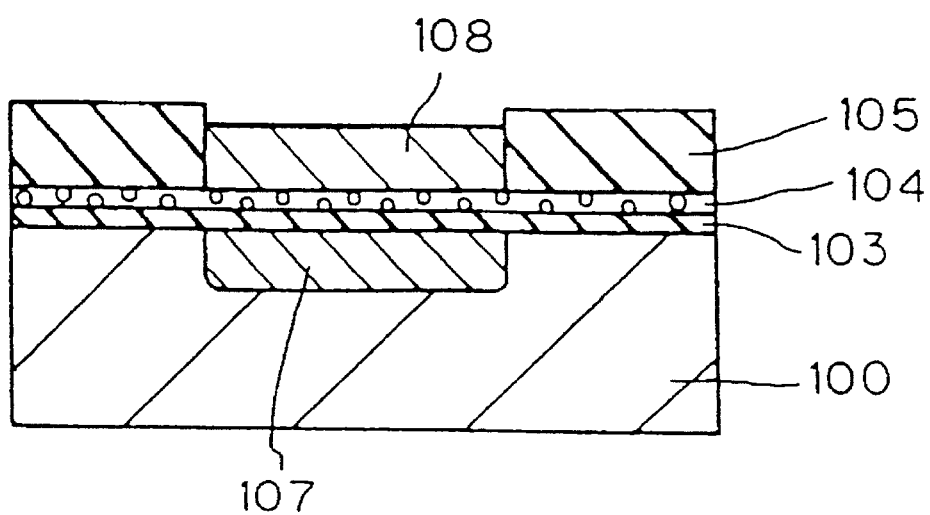

With reference to FIG. 2B, the photo-resist pattern 120 is completely removed. A selective chemical vapor deposition method with use of a $WF_6/H_2$ gas is accomplished at a temperature of 300° C. wherein the remaining thick silicon oxide film 105 serves as a mask so that a tungsten film 108 having a thickness of approximately 250 nanometers is selectively grown on the exposed top surface of the polycrystalline silicon film 104 in which the tungsten film is formed in the opening of the remaining thick silicon oxide film 105.

Figure 2C:
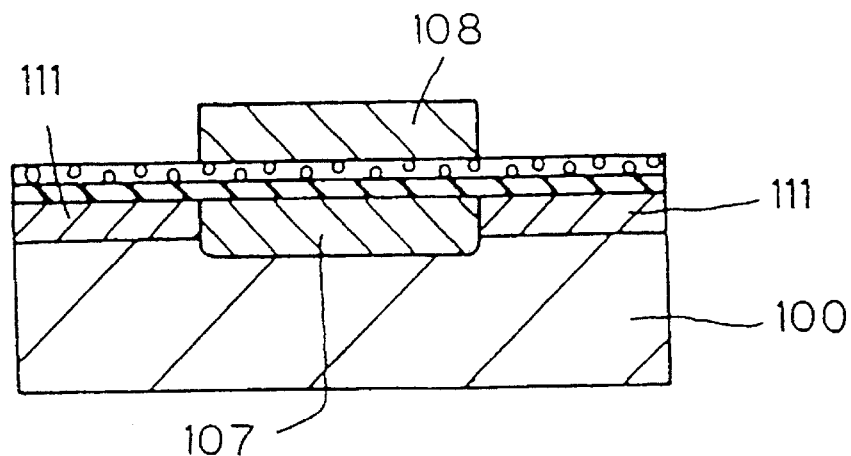

With reference to FIG. 2C, the remaining thick silicon oxide film 105 is completely removed by a wet etching. A further ion-implantation of a p-type dopant such as boron is accomplished wherein the tungsten film 108 existing over the n-type charge transfer region 107 serves as a mask. The p-type dopant is implanted at such an energy that the p-type dopant penetrates through the polycrystalline silicon film 104 and the thin silicon oxide film 103 and implanted into an upper portion of the p-type semiconductor substrate 100. As a result, a $p^+$-type isolation region 111 having a higher dopant concentration than a dopant concentration of the p-type semiconductor substrate 100 is formed at the upper portion of the p-type semiconductor substrate 100 except in the n-type charge transfer region 107. Namely, the $p^+$-type isolation region 111 is provided to surround the n-type charge transfer region 107 by self-alignment technique.

Figure 2D:
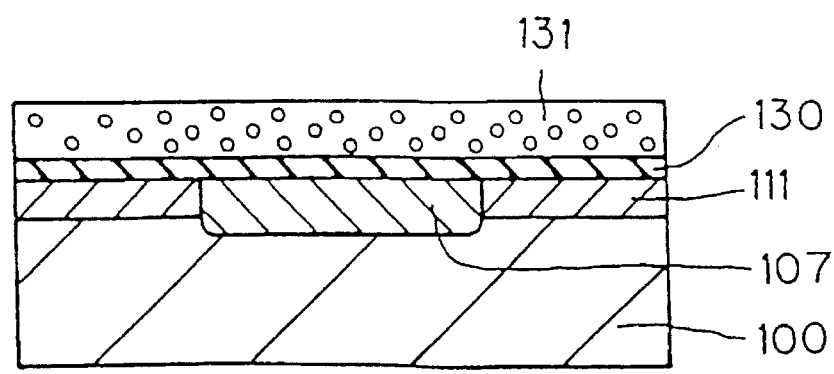

With reference to FIG. 2D, the tungsten film 108 is removed by a wet etching method using a $H_2O_2$ liquid. Further, the polycrystalline silicon film 104 and the thin silicon oxide film are removed by a wet etching so as to expose top surfaces of the n-type charge transfer region 107 and the $p^+$-type isolation region 111. A thermal oxidation is accomplished to form a first gate oxide film 130 on the entire top surfaces of the n-type charge transfer region 107 and the $p^+$-type isolation region 111. A contact hole is formed in the first gate oxide film 130. A first charge transfer electrode 131 is formed by uses of a low pressure chemical vapor deposition method, a photo-lithography method and a plasma etching method. The first charge transfer electrode 131 is electrically coupled through the contact hole to the active region. Subsequently, an additional ion-implantation of a p-type dopant such as boron is accomplished by use of the first charge transfer electrode 131 as a mask to form a potential barrier in the n-type charge transfer region 107. The first gate oxide film 130 is selectively removed by an etching method in which the first charge transfer electrode 131 serves as a mask thereby a part of the first gate oxide film 130 under the charge transfer electrode 131 remains. A further thermal oxidation is accomplished to form a second gate oxide film not illustrated before a second charge transfer electrode not illustrated is formed by uses of the low pressure chemical vapor deposition method, the photo-lithography method and the plasma etching method. As a result, fabrication processes for the charge transfer device according to the present invention is completed.

The above novel fabrication processes are able to provide advantages in the following matters. It would be very important that the above sequential fabrication processes includes none of any thermal oxidation for forming a thick silicon oxide film on any active region or the n-type charge transfer region 107. Then, the active region or the n-type charge transfer region 107 neither receives a damage due to a heat treatment or the thermal oxidation to form the thick silicon oxide film nor includes any crystal defect. None of a heat treatment such as the thermal oxidation process influential against any active region or the n-type charge transfer region 107 is able to suppress any appearance of dislocations such as the dislocation loop in its lattice structure. This provides a perfection of the crystal or lattice structure of the active region or the n-type charge transfer region 107. None of the heat treatment such as the thermal oxidation process influential against the n-type charge transfer region 107 is further able to suppress any variation of an impurity concentration profile for the active region or the n-type charge transfer region 107. Those enable the resultant charge transfer device to possess or show excellent properties and performances.

A second embodiment according to the present invention will be described with reference to FIGS. 3A to 3F. The second embodiment provides a novel fabrication method for a solid state imaging device.

Figure 3A:
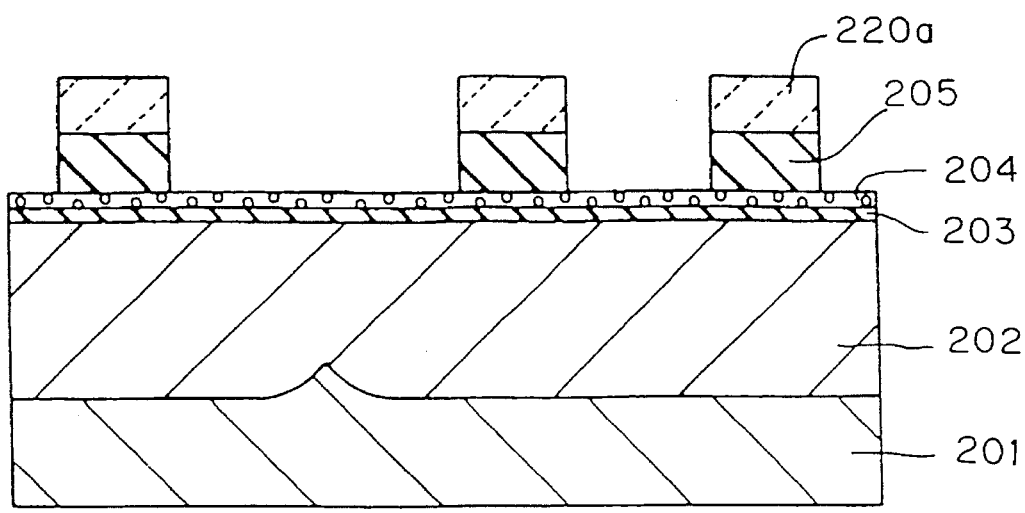
FIGS. 3A to 3F are fragmentary cross sectional elevation views illustrative of sequential steps involved in a novel fabrication method of a solid state imaging device in a second embodiment according to the present invention.

With reference to FIG. 3A, an n-type semiconductor substrate 201 is prepared to be formed with a p-type well region 202 thereon. A thin silicon oxide film 203 having a thickness of approximately 20 nanometers is grown on a top surface of the p-type well region 202 and subsequently a polycrystalline silicon film 204 having a thickness of approximately 50 nanometers is grown on a top surface of the thin silicon oxide film 203. A thick silicon oxide film 205 having a thickness of approximately 300 nanometers is grown on a top surface of the polycrystalline silicon film 204. A first photo-resist film is provided on an entire top surface of the thick silicon oxide film 204 to be patterned for a formation of a first photo-resist pattern 220a. The silicon oxide film 205 is selectively removed by a plasma etching in which the first photo-resist pattern 220a is used as a mask so that part of the silicon oxide film 205 covered by the first photo-resist pattern 220a remains on the polycrystalline silicon film 204.

Figure 3B:
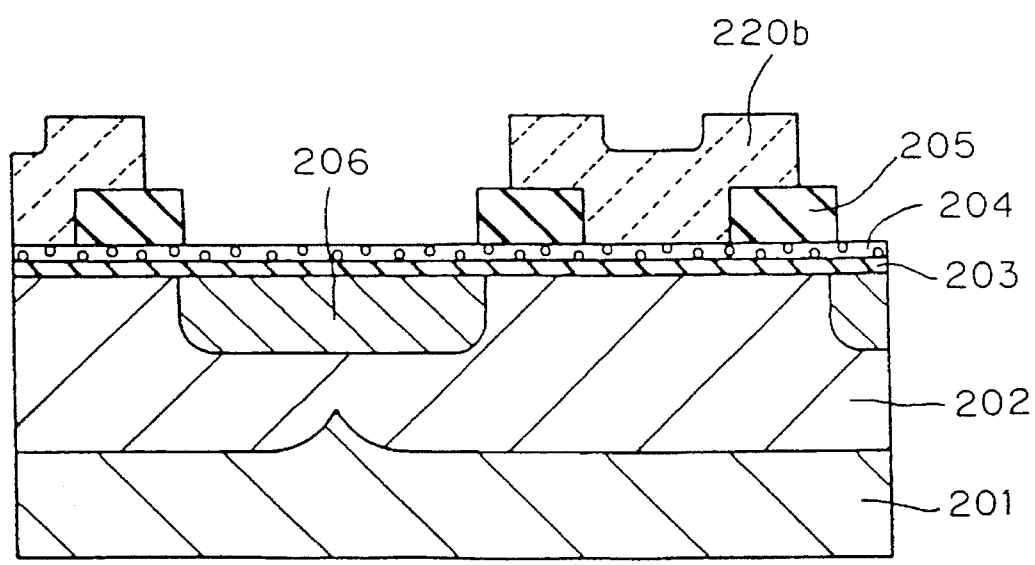

With reference to FIG. 3B, the first photo-resist pattern 220a is completely removed, after which a second photo-resist pattern is provided on the top surface of the device so as to cover the remaining silicon oxide film 205. The second photo-resist film is patterned to be selectively removed so that a second photo-resist pattern 220b is formed in a predetermined area within which charge transfer region will be provided. An ion-implantation of an n-type dopant such as phosphorus is accomplished wherein both the second photo-resist pattern 220b and the remaining silicon oxide film 205 serve as masks. The n-type dopant is implanted at such an energy that the n-type dopant penetrates through both the thin silicon oxide film 203 and the polycrystalline silicon film 204 and further implanted into a predetermined upper portion of the p-type well region 202. As a result, an n-type region serving as an opto-electro conversion region 206 is selectively formed at the predetermined upper portion of the p-type well region 202 neither covered by the remaining silicon oxide film 205 nor covered by the second photo-resist pattern 220b.

Figure 3C:
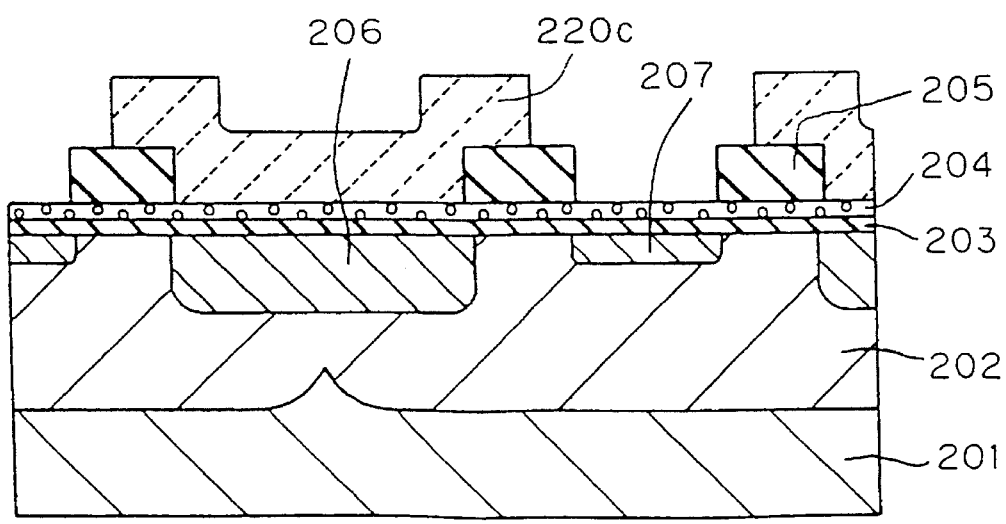

With reference to FIG. 3C, the second photo-resist pattern 220b is completely removed before a third photo-resist film is provided on the top surface of the device so as to cover the remaining silicon oxide film 205. The third photo-resist film is patterned to be selectively removed so that a third photo-resist pattern 220c is formed to cover an area over the opto-electro conversion region 206. An ion-implantation of an n-type dopant such as phosphorus is accomplished with uses of both the third photo-resist pattern 220c and the remaining silicon oxide film 205 as masks. The n-type dopant is implanted at such an energy that the n-type dopant penetrates through both the polycrystalline silicon film 204 and the thin silicon oxide film 203 and then implanted into a predetermined upper portion of the p-type well region 202. As a result, an n-type region serving as a charge transfer region 207 is selectively formed at the predetermined upper portion of the p-type well region 202 which is neither covered with the remaining silicon oxide film 205 nor covered by the third photo-resist pattern 220c. The n-type charge transfer region 207 is defined to be shallower as compared to the n-type opto-electro conversion region 206.

Figure 3D:
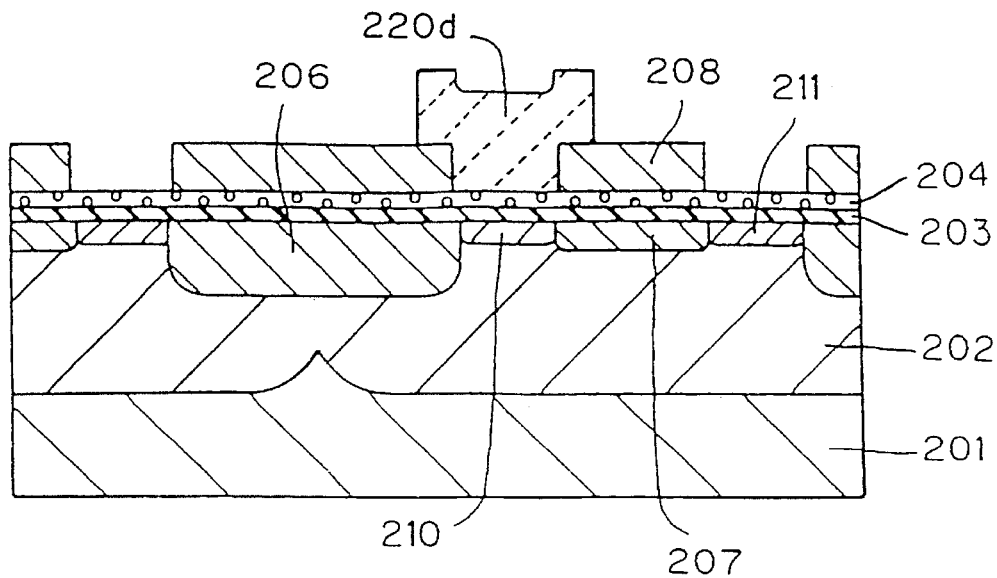

With reference to FIG. 3D, the third photo-resist pattern 220c is completely removed. A selective chemical vapor deposition is accomplished by use of the remaining thick silicon oxide film 205 as a mask so that a tungsten film 208 having a thickness of approximately 250 nanometers is grown on the polycrystalline silicon film 204. The tungsten film 208 is formed between the remaining thick silicon oxide film 205. From the above description, it is readily be appreciated that none of the remaining thick silicon oxide film 205 exists over the active regions such as the opto-electo conversion region 206 and the charge transfer region 207. Thus, the tungsten film 208 is provided over the active regions such as the opto-electro conversion region 206 and the charge transfer region 207. The remaining thick silicon oxide film 205 is completely removed by a wet etching method. An ion-implantation of a p-type dopant such as boron is accomplished with use of the tungsten film 208 as a mask. The p-type dopant is implanted at such an energy as to enable the p-type dopant to penetrate through both the polycrystalline silicon film 204 and the thin silicon oxide film 203 and then implanted into a predetermined upper portion of the p-type well region 202 except in the active regions such as the-opto-electro conversion region 206 and the charge transfer region 207. The above ion-implantation of the p-type dopant forms by self-alignment technique a p-type signal read region 210 having a higher dopant concentration than a dopant concentration of the p-type well region 202. A threshold value of the p-type signal read region 210 is controlled by this ion-implantation of the p-type dopant. A fourth photo-resist film is provided on an entire top surface of the device to cover the tungsten film 208 and the polycrystalline silicon film 204. The fourth photo-resist film is patterned to be made into a fourth photo-resist pattern 220d which exists only over the p-type signal read region 210 and its peripheral region. An additional ion-implantation of a p-type dopant such as boron is accomplished in which both the fourth photo-resist pattern 220d and the tungsten film 208 serve as masks. The p-type dopant is implanted at such an energy that it penetrates through both the polycrystalline silicon film 204 and the thin silicon oxide film 203 and then implanted into the upper portion of the p-type well region 202 except both in the p-type signal read region 210 and in the active regions such as the opto-electro conversion region 206 and the charge transfer region 207. The above additional ion-implantation of the p-type dopant forms by self-alignment technique a $p^+$-isolation region 211 having a higher dopant concentration than dopant concentrations of the p-type well region 202 and the p-type signal read region 210. The $p^+$-isolation region 211 is provided to isolate the opto-electro conversion region 206 from the charge transfer region 207.

Figure 3E:
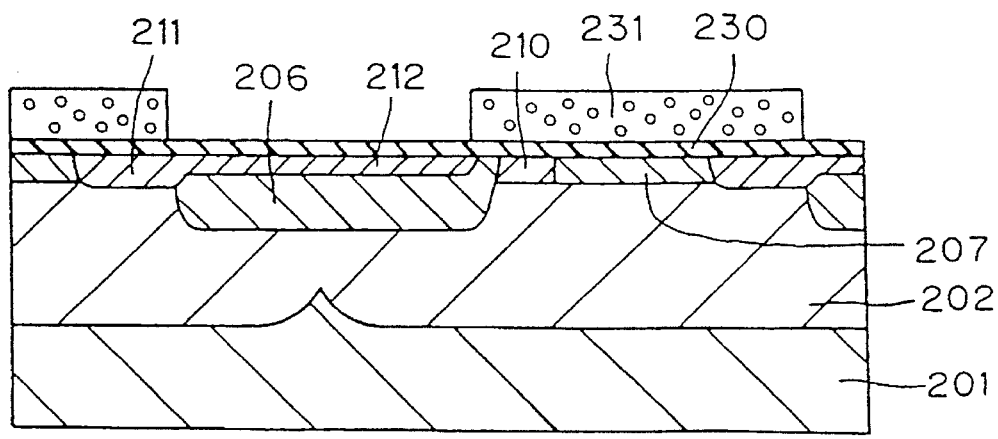
Figure 3F:
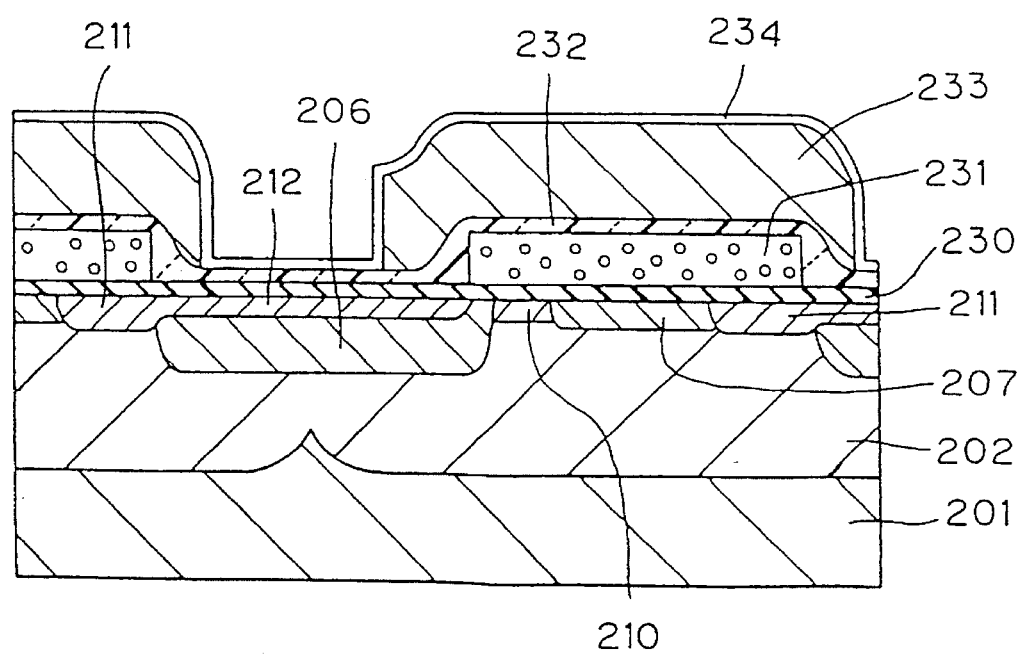

With reference to FIG. 3E, the fourth photo-resist pattern 220d is completely removed and subsequently the tungsten film 208 is removed by a wet etching which uses a $H_2O_2$ liquid. Further, the polycrystalline silicon film 204 and the thin silicon oxide film 203 are sequentially removed by a wet etching. A thermal oxidation is accomplished to form a first gate oxide film which is not illustrated. Subsequently, a first charge transfer electrode which is not illustrated is formed by uses of a low pressure chemical vapor deposition method, a photo-lithography method and a plasma etching method. The first charge transfer electrode serves to conduct the charge transfer. The first gate oxide film is selectively removed by an etching in which the first charge transfer electrode is used as a mask. An additional thermal oxidation is accomplished to form a second gate oxide film 230 on an entire top surface of the device. Subsequently, a second charge transfer electrode 231 is formed by use of the low pressure chemical vapor deposition method, the photolithography method and the plasma etching method. The second charge transfer electrode 231 serves to conduct both a read operation of a signal charge and a charge transfer from the opto-electro conversion region 206 to the charge transfer region 207. A further ion-implantation of a p-type dopant such as boron is accomplished with use of the second charge transfer electrode 23 as a mask to form a $p^+$-type shallow region 212 over the opto-electro conversion region 206. The p-type dopant is implanted at such an energy as to enable the p-type dopant to penetrate through the second gate oxide film 230 and implanted into an upper portion of the n-type opto-electro conversion region 206. The above further ion-implantation is continued until the above upper portion thereof implanted with the p-type dopant is made into the $p^+$-type shallow region.

With reference to FIG.. 3F, an inter-layer insulator 232 is deposited to cover both the second charge transfer electrode 231 and an exposed portion of the second gate oxide film 230. A contact hole which is not illustrated is formed in the inter-layer insulator 232 so that a part of the second charge transfer electrode 231 is exposed through the contact hole. A metal film 233 to serve not only as a wiring but also as a photo mask is selectively formed on part of the inter-layer insulator 232 over the charge transfer electrode 231. A protective silicon oxide film 234 is formed on an entire surface of the device to cover both the metal film 233 and an exposed surface of the inter-layer insulator 232 thereby the fabrication processes for the solid state imaging device according to the present invention are completed.

The above novel fabrication processes has advantages in the following matters. It would be very important that the above sequential fabrication processes includes none of any thermal oxidation for forming a thick silicon oxide film on any active regions or the n-type charge transfer region 207 and the n-type opto-electro conversion region 206. Then, the active regions or the n-type charge transfer region 207 and the n-type opto-electro conversion region 206 neither receive any damage due to such a heat treatment as the thermal oxidation to form the thick silicon oxide film nor includes any crystal defect. None of such a heat treatment as the thermal oxidation process influential against any active regions or the n-type charge transfer region 107 and the n-type opto-electro conversion region 206 is able to suppress any appearance of dislocations such as the dislocation loop in its lattice structure. This allows a perfection of the crystal or lattice structure if the active region or the n-type charge transfer region 207. None of the heat treatment such as the thermal oxidation process influential against either the n-type charge transfer region 207 or the n-type opto-electro conversion region 206 is further able to suppress any variation of an impurity concentration profile for the active regions or the n-type charge transfer region 207 and the n-type opto-electro conversion region 206. Those permit the resultant solid state imaging device to possess or show excellent properties and performances.

A third embodiment according to the present invention will be described with reference to FIGS. 4A to 4F. The third embodiment provides another novel fabrication method for a solid state imaging device.

Figure 4A:
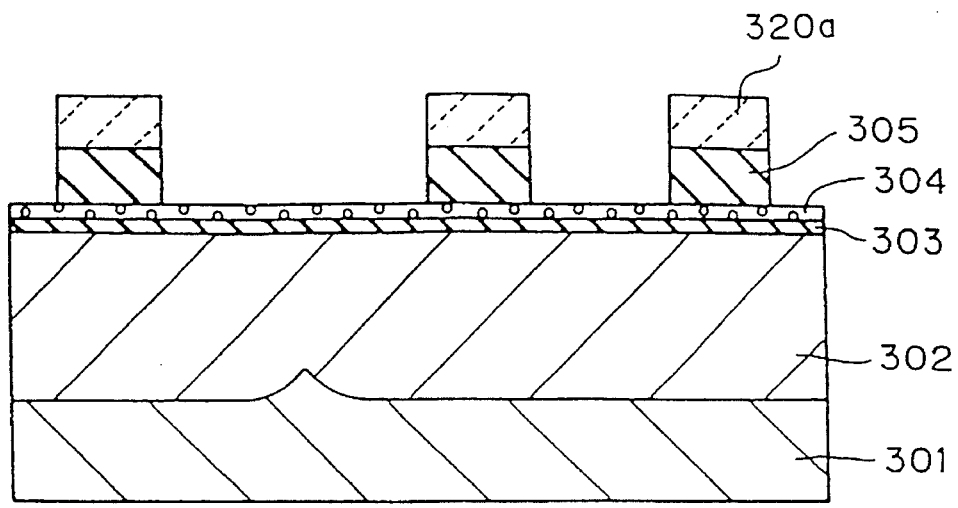
FIGS. 4A to 4F are fragmentary cross sectional elevation views illustrative of sequential steps involved in a novel fabrication method of a solid state imaging device in a third embodiment according to the present invention.

With reference to FIG. 4A, an n-type semiconductor substrate 301 is prepared to be formed with a p-type well region 302 thereon. A thin silicon oxide film 303 having a thickness of approximately 20 nanometers is grown on a top surface of the p-type well region 302 and subsequently a polycystalline silicon film 304 having a thickness of approximately 100 nanometers is grown on a top surface of the thin silicon oxide film 303. A thick silicon oxide film 305 having a thickness of approximately 350 nanometers is grown on a top surface of the polycrystalline silicon film 304. A first photo-resist film is provided on an entire top surface of the thick silicon oxide film 305 to be patterned for a formation of a first photo-resist pattern 320a. The thick silicon oxide film 305 is selectively removed by a plasma etching in which the first photo-resist pattern 320a is used as a mask so that part of the silicon oxide film 305 covered by the first photo-resist pattern 320a remains on the polycrystalline silicon film 304.

Figure 4B:
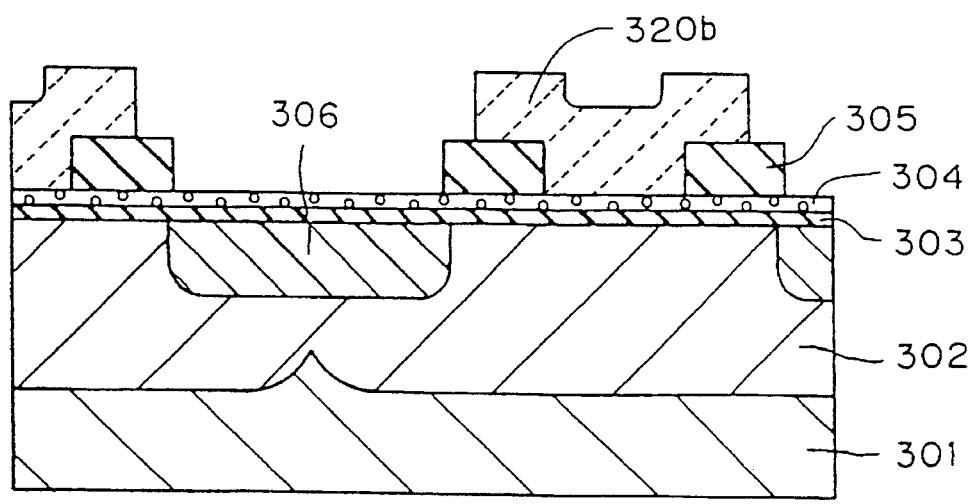

With reference to FIG. 4B, the first photo-resist pattern 320a is completely removed, after which a second photo-resist pattern is provided on the top surface of the device so as to cover the remaining silicon oxide film 305. The second photo-resist film is patterned to be selectively removed so that a second photo-resist pattern 320b is formed in a predetermined area within which a charge transfer region will be provided. An ion-implantation of an n-type dopant such as phosphorus is accomplished wherein both the second photo-resist pattern 320b and the remaining silicon oxide film 305 serve as masks. The n-type dopant is implanted at such an energy that the n-type dopant penetrates through both the thin silicon oxide film 303 and the polycrystalline silicon film 304 and further implanted into a predetermined upper portion of the p-type well region 302. As a result, an n-type region serving as an opto-electro conversion region 306 is selectively formed at the predetermined upper portion of the p-type well region 302 neither covered by the remaining silicon oxide film 305 nor covered by the second photo-resist pattern 320b.

Figure 4C:
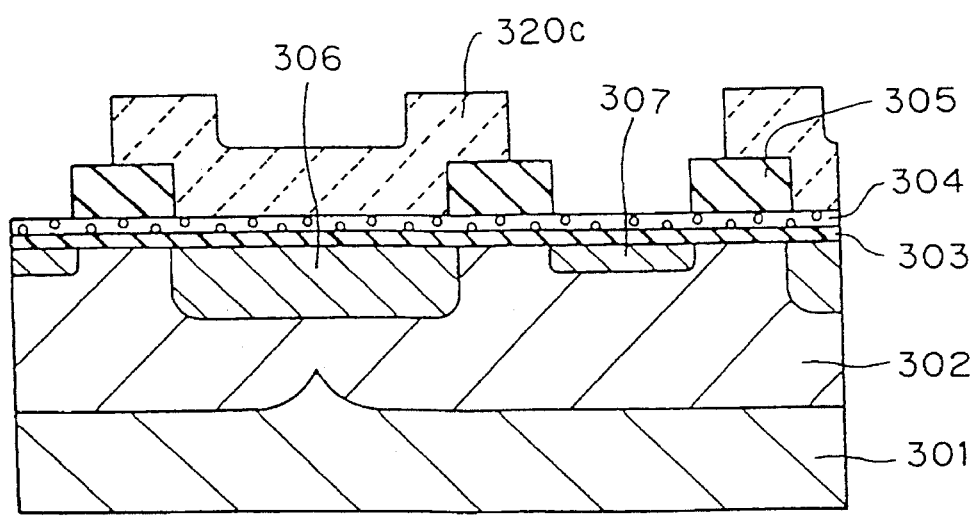

With reference to FIG. 4C, the second photo-resist pattern 320b is completely removed before a third photo-resist film is provided on the top surface of the device so as to cover the remaining silicon oxide film 305. The third photo-resist film is patterned to be selectively removed so that a third photo-resist pattern 320c is formed to cover an area over the opto-electro conversion region 306. An ion-implantation of an n-type dopant such as phosphorus is accomplished with uses of both the third photo-resist pattern 320c and the remaining silicon oxide film 305 as masks. The n-type dopant is implanted at such an energy that the n-type dopant penetrates through both the polycrystalline silicon film 304 and the thin silicon oxide film 303 and then implanted into a predetermined upper portion of the p-type well region 302. As a result, an n-type region serving as a charge transfer region 307 is selectively formed at the predetermined upper portion of the p-type well region 302 which is neither covered with the remaining silicon oxide film 305 nor covered by the third photo-resist pattern 320c. The n-type charge transfer region 307 is defined to be shallower as compared to the n-type opto-electro conversion region 306.

Figure 4D:
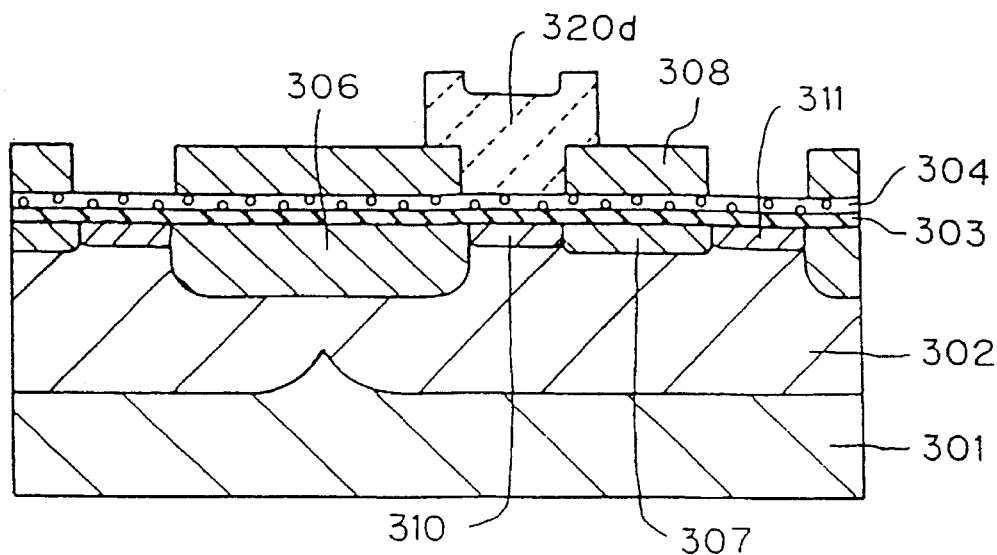

With reference to FIG. 4D, the third photo-resist pattern 320c is completely removed. A selective chemical vapor deposition is accomplished by use of the remaining thick silicon oxide film 305 as a mask so that an aluminium film 308 having a thickness of approximately 300 nanometers is grown on the polycrystalline silicon film 304. The aluminium film 308 is formed between the remaining thick silicon oxide film 305. From the above description, it is readily be appreciated that none of the remaining thick silicon oxide film 305 exists over the active regions such as the opto-electo conversion region 306 and the charge transfer region 307. Thus, the aluminium film 308 is provided over the active regions such as the opto-electro conversion region 306 and the charge transfer region 307. The remaining thick silicon oxide film 305 is completely removed by a wet etching method. An ion-implantation of a p-type dopant such as boron is accomplished with use of the aluminium film 308 as a mask. The p-type dopant is implanted at such an energy as to enable the p-type dopant to penetrate through both the polycrystalline silicon film 304 and the thin silicon oxide film 303 and then implanted into a predetermined upper portion of the p-type well region 302 except in the active regions such as the opto-electro conversion region 306 and the charge transfer region 307. The above ion-implantation of the p-type dopant forms by self-alignment technique a p-type signal read region 310 having a higher dopant concentration than a dopant concentration of the p-type well region 302. A threshold value of the p-type signal read region 310 is controlled by this ion-implantation of the p-type dopant. A fourth photo-resist film is provided on an entire top surface of the device to cover the aluminium film 308 and the polycrystalline silicon film 304. The fourth photo-resist film is patterned to be made into a fourth photo-resist pattern 320d which exists only over the p-type signal read region 310 and its peripheral region. An additional ion-implantation of a p-type dopant such as boron is accomplished in which both the fourth photo-resist pattern 320d and the aluminium film 308 serve as masks. The p-type dopant is implanted at such an energy that it penetrates through both the polycrystalline silicon film 304 and the thin silicon oxide film 303 and then implanted into the upper portion of the p-type well region 302 except both in the p-type signal read region 310 and in the active regions such as the opto-electro conversion region 306 and the charge transfer region 307. The above additional ion-implantation of the p-type dopant forms by self-alignment technique a $p^+$-isolation region 311 having a higher dopant concentration than dopant concentrations of the p-type well region 302 and the p-type signal read region 310. The $p^+$-isolation region 311 is provided to isolate the opto-electro conversion region 306 from the charge transfer region 307.

Figure 4E:
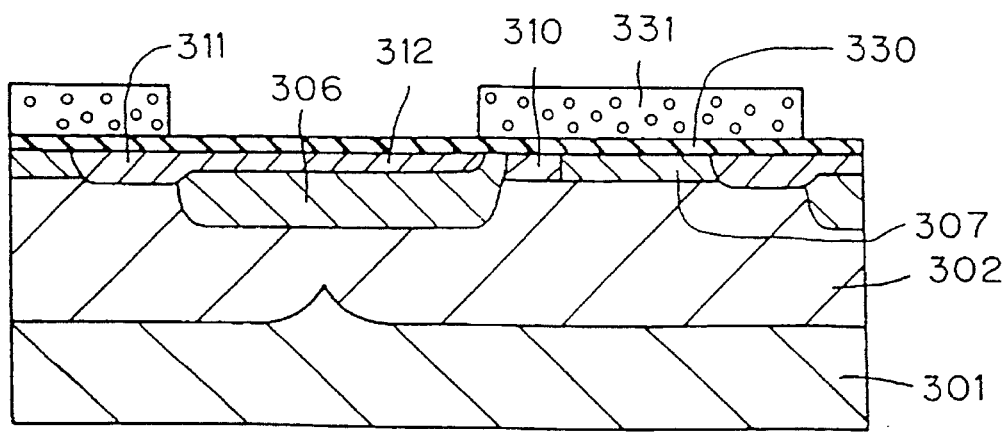

With reference to FIG. 4E, the fourth photo-resist pattern 320d is completely removed and subsequently the aluminium film 308 is removed by a wet etching which uses a phosphoric acid. Further, the polycrystalline silicon film 304 and the thin silicon oxide film 303 are sequentially removed by a wet etching. A thermal oxidation is accomplished to form a first gate oxide film which is not illustrated. Subsequently, a first charge transfer electrode which is not illustrated is formed by uses of a low pressure chemical vapor deposition method, a photo-lithography method and a plasma etching method. The first charge transfer electrode serves to conduct the charge transfer. The first gate oxide film is selectively removed by an etching in which the first charge transfer electrode is used as a mask. An additional thermal oxidation is accomplished to form a second gate oxide film 330 on an entire top surface of the device. Subsequently, a second charge transfer electrode 331 is formed by use of the low pressure chemical vapor deposition method, the photolithography method and the plasma etching method. The second charge transfer electrode 331 serves to conduct both a read operation of a signal charge and a charge transfer from the opto-electro conversion region 306 to the charge transfer region 307. A further ion-implantation of a p-type dopant such as boron is accomplished with use of the second charge transfer electrode 331 as a mask to form a $p^+$-type shallow region 312 over thereto-electro conversion region 306. The p-type dopant is implanted at such an energy as to enable the p-type dopant to penetrate through the second gate oxide film 330 and implanted into an upper portion of the n-type opto-electro conversion region 306. The above further ion-implantation is continued until the above upper portion thereof implanted with the p-type dopant is made into the $p^+$-type shallow region 312.

Figure 4F:
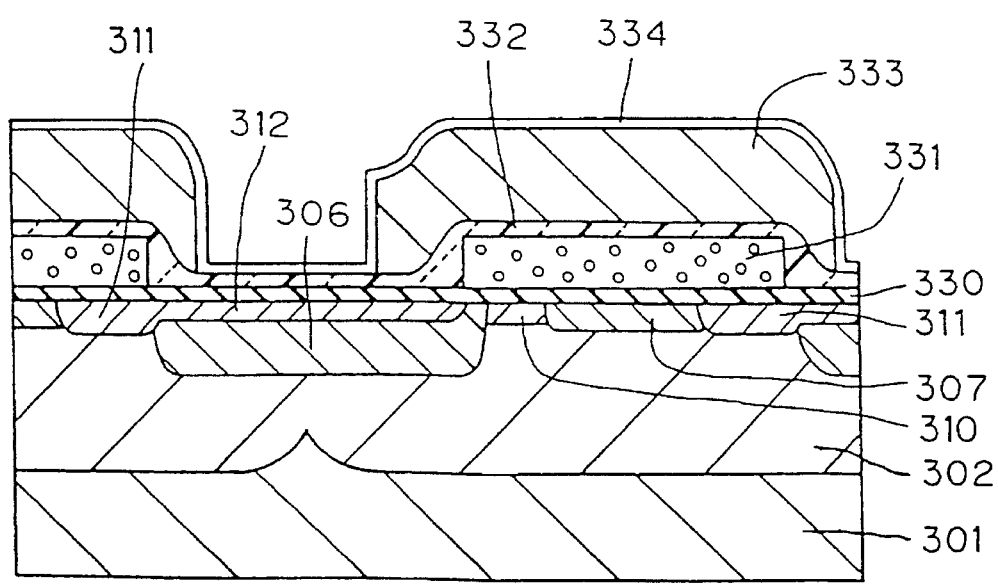

With reference to FIG. 4F, an inter-layer insulator 332 is deposited to cover both the second charge transfer electrode 331 and an exposed portion of the second gate oxide film 330. A contact hole which is not illustrated is formed in the inter-layer insulator 332 so that a part of the second charge transfer electrode 331 is exposed through the contact hole. A metal film 333 to serve not only as a wiring but also as a photo mask is selectively formed on part of the inter-layer insulator 332 over the charge transfer electrode 331. A protective silicon oxide film 334 is formed on an entire surface of the device to cover both the metal film 333 and an exposed surface of the inter-layer insulator 332 thereby the fabrication processes for the solid state imaging device according to the present invention are completed.

The above novel fabrication processes has advantages in the following matters. It would be very important that the above sequential fabrication processes includes none of any thermal oxidation for forming a thick silicon oxide film on any active regions or the n-type charge transfer region 307 and the n-type opto-electro conversion region 306. Then, the active regions or the n-type charge transfer region 307 and the n-type opto-electro conversion region 306 neither receive any damage due to such a heat treatment as the thermal oxidation to form the thick silicon oxide film nor includes any crystal defect. None of such a heat treatment as the thermal oxidation process influential against any active regions or the n-type charger transfer region 107 and the n-type opto-electro conversions region 306 is able to suppress any appearance of dislocations such as the dislocation loop in its lattice structure. This allows a perfection of the crystal or lattice structure of the active region or the n-type charge transfer region 307. None of the heat treatment such as the thermal oxidation process influential against either the n-type charge transfer region 307 or the n-type opto-electro conversion region 306 is further able to suppress any variation of an impurity concentration profile for the active regions or the n-type charge transfer region 307 and the n-type opto-electro conversion region 306. Those permit the resultant solid state imaging device to possess or show excellent properties and performances.

A fourth embodiment according to the present invention will be described with reference to FIGS. 5A to 5F. The fourth embodiment provides another novel fabrication method for a solid state imaging device.

Figure 5A:
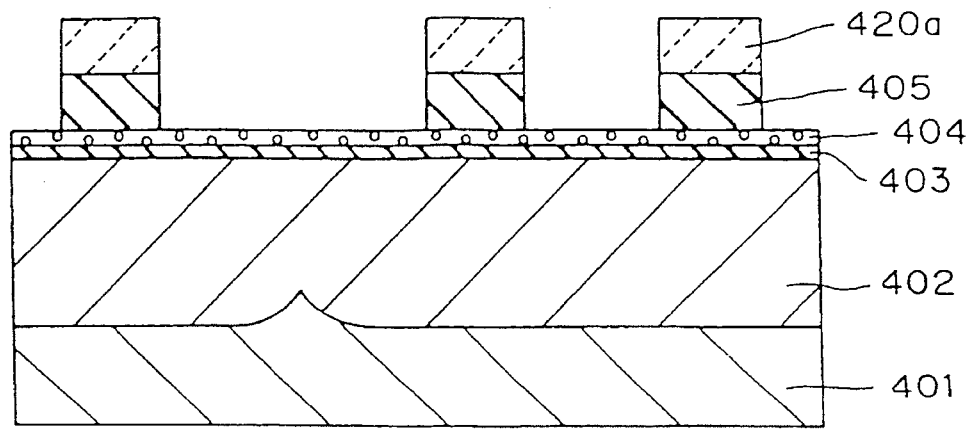
FIGS. 5A to 5F are fragmentary cross sectional elevation views illustrative of sequential steps involved in a novel fabrication method of a solid state imaging device in a fourth embodiment according to the present invention.

With reference to FIG. 5A, an n-type semiconductor substrate 401 is prepared to be formed with a p-type well region 402 thereon. A thin silicon oxide film 403 having a thickness of approximately 20 nanometers is grown on a top surface of the p-type well region 402 and subsequently a polycrystalline silicon film 404 having a thickness of approximately 50 nanometers is grown on a top surface of the thin silicon oxide film 403. A thick silicon oxide film 405 having a thickness of approximately 300 nanometers is grown on a top surface of the polycrystalline silicon film 404. A first photo-resist film is provided on an entire top surface of the thick silicon oxide film 405 to be patterned for a formation of a first photo-resist pattern 420a. The silicon oxide film 405 is selectively removed by a plasma etching in which the first photo-resist pattern 420a is used as a mask so that part of the silicon oxide film 405 covered by the first photo-resist pattern 420a remains on the polycrystalline silicon film 404.

Figure 5B:
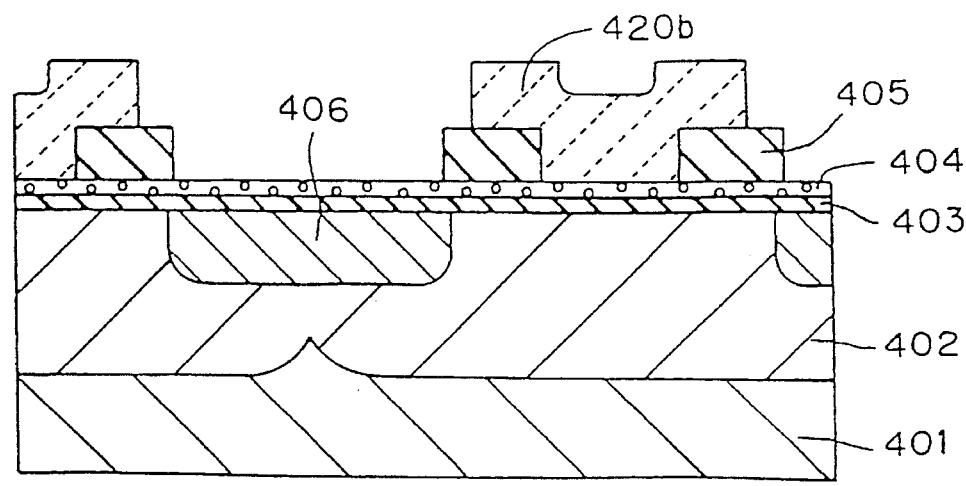

With reference to FIG. 5B, the first photo-resist pattern 420a is completely removed, after which a second photo-resist pattern is provided on the top surface of the device so as to cover the remaining silicon oxide film 405. The second photo-resist film is patterned to be selectively removed so that a second photo-resist pattern 420b is formed in a predetermined area within which a charge transfer region will be provided. An ion-implantation of an n-type dopant such as phosphorus is accomplished wherein both the second photo-resist pattern 420b and the remaining silicon oxide film 405 serve as masks. The n-type dopant is implanted at such an energy that the n-type dopant penetrates through both the thin silicon oxide film 403 and the polycrystalline silicon film 404 and further implanted into a predetermined upper portion of the p-type well region 402. As a result, an n-type region serving as an opto-electro conversion region 406 is selectively formed at the predetermined upper portion of the p-type well region 402 neither covered by the remaining silicon oxide film 405 nor covered by the second photo-resist pattern 420b.

Figure 5C:
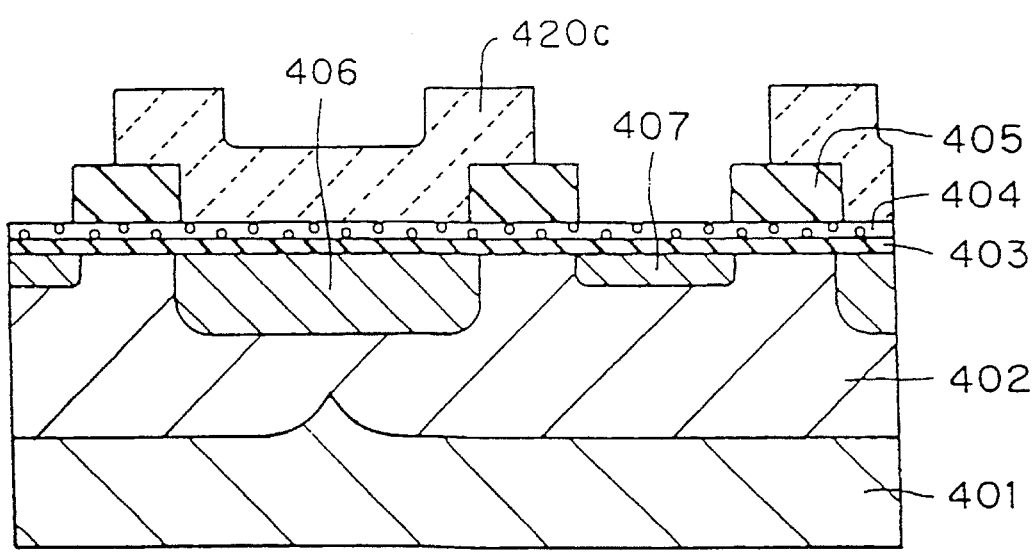

With reference to FIG. 5C, the second photo-resist pattern 420b is completely removed before a third photo-resist film is provided on the top surface of the device so as to cover the remaining silicon oxide film 405. The third photo-resist film is patterned to be selectively removed so that a third photo-resist pattern 420c is formed to cover an area over the opto-electro conversion region 406. An ion-implantation of an n-type dopant such as phosphorus is accomplished with uses of both the third photo-resist pattern 420c and the remaining silicon oxide film 405 as masks. The n-type dopant is implanted at such an energy that the n-type dopant penetrates through both the polycrystalline silicon film 404 and the thin silicon oxide film 403 and then implanted into a predetermined upper portion of the p-type well region 402. As a result, an n-type region serving as a charge transfer region 407 is selectively formed at the predetermined upper portion of the p-type well region 402 which is neither covered with the remaining silicon oxide film 405 nor covered by the third photo-resist pattern 420c. The n-type charge transfer region 407 is defined to be shallower as compared to the n-type opto-electro conversion region 406.

Figure 5D:
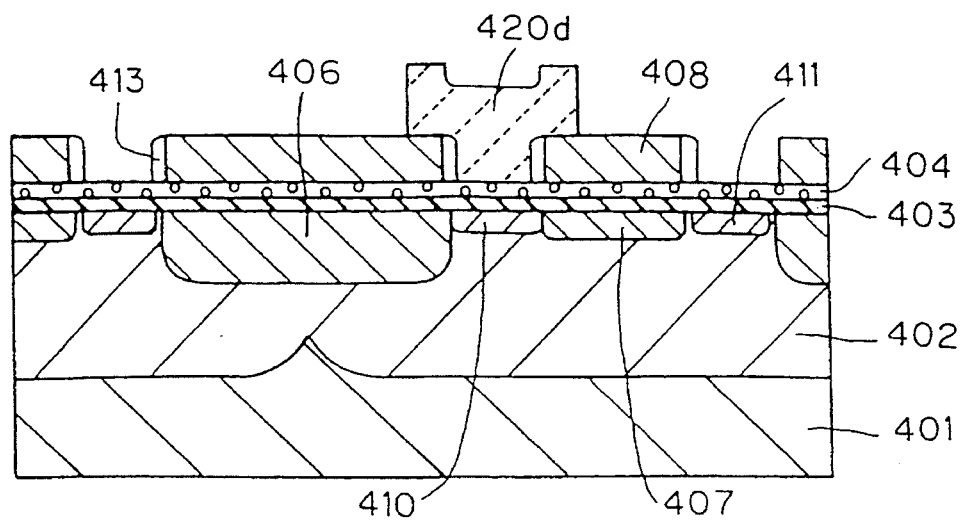

With reference to FIG. 5D, the third photo-resist pattern 420c is completely removed. A selective chemical vapor deposition is accomplished by use of the remaining thick silicon oxide film 405 as a mask so that a tungsten film 408 having a thickness of approximately 250 nanometers is grown on the polycrystalline silicon film 404. The tungsten film 408 is formed between the remaining thick silicon oxide film 405. From the above description, it is readily be appreciated that none of the remaining thick silicon oxide film 405 exists over the active regions such as the opto-electo conversion region 406 and the charge transfer region 407. Thus, the tungsten film 408 is provided over the active regions such as the opto-electro conversion region 406 and the charge transfer region 407. The remaining thick silicon oxide film 405 is completely removed by a wet etching method. An ion-implantation of a p-type dopant such as boron is accomplished with use of the tungsten film 408 as a mask. The p-type dopant is implanted at such an energy as to enable the p-type dopant to penetrate through both the polycrystalline silicon film 404 and the thin silicon oxide film 403 and then implanted into a predetermined upper portion of the p-type well region 402 except in the active regions such as the opto-electro conversion region 406 and the charge transfer region 407. The above ion-implantation of the p-type dopant forms by self-alignment technique a p-type signal read region 410 having a higher dopant concentration than a dopant concentration of the p-type well region 402. A threshold value of the p-type signal read region 410 is controlled by this ion-implantation of the p-type dopant.

A silicon oxide film having a predetermined thickness for example approximately 0.2 micrometers is deposited by a chemical vapor deposition method on an entire surface of the device to cover the tungsten film 408. The chemical vapor deposited silicon oxide film is subjected to an anisotropic etching so as to remain only at opposite side portions of the tungsten film 408. The remaining chemical vapor deposited silicon oxide film serves as side walls 413. A lateral length or a lateral thickness of the side walls 413 is defined by a thickness of the chemical vapor deposited silicon oxide film 413. As described above, the method for forming the side walls 413 may be the method which has been well known and commonly used in the fabrication processes for a semiconductor device such as a lightly do;bed drain metal oxide semiconductor field effect transistor (a LDDMOSFET). A fourth photo-resist film is provided on an entire top surface of the device to cover the tungsten film 408 and the polycrystalline silicon film 404. The fourth photo-resist film is patterned to be made into a fourth photo-resist pattern 420d which exists only over the p-type signal read region 410 and its peripheral region.

An additional ion-implantation of a p-type dopant such as boron is accomplished in which not only the fourth photo-resist pattern 420d and the tungsten film 408 but also the side walls 413 serve as masks. The p-type dopant is implanted at such an energy that it penetrates through both the polycrystalline silicon film 404 and the thin silicon oxide film 403 and then implanted into the upper portion of the p-type well region 402 except not only both in the p-type signal read region 410 and in the active regions such as the opto-electro conversion region 406 and the charge transfer region 407 but also an area covered by the side walls 413. As described above, the tungsten film 408 exists over the active regions such as the n-type opto-electro conversion region 406 and the n-type charge transfer region 407. Namely, an edge of the tungsten film 408 corresponds to in the plane view an edge of the active region. It is important that the existence of the side walls 413 serving as masks is able to present the p-type dopant to be implanted at a very near portion to the n-type active regions such as the opto-electro conversion region 406 and the charge transfer region 407. The above additional ion-implantation of the p-type dopant forms by self-alignment technique a $p^+$-isolation region 411 having a higher dopant concentration than dopant concentrations of the p-type well region 402 and the p-type signal read region 410. The existence of the side walls 413 renders the $p^+$-isolation region 411 be not in contact with or be separated through a part of the p-type well region 402 from the active regions such as the n-type opto-electro conversion region 406 and the n-type charge transfer region 407. The p$^+$-isolation region 411 is provided to isolate the opto-electro conversion region 406 from the charge transfer region 407. A lateral distance between the p$^+$-type isolation region 411 and the active regions such as the opto-electro conversion region 406 and the charge transfer region 407 is variable by changing the lateral size of the side walls 413 in which the lateral size is controllable by controlling the thickness of the chemical vapor deposited silicon oxide film. For example, a prefer lateral distance thereof is approximately 0.2 micrometers.

Figure 5E:
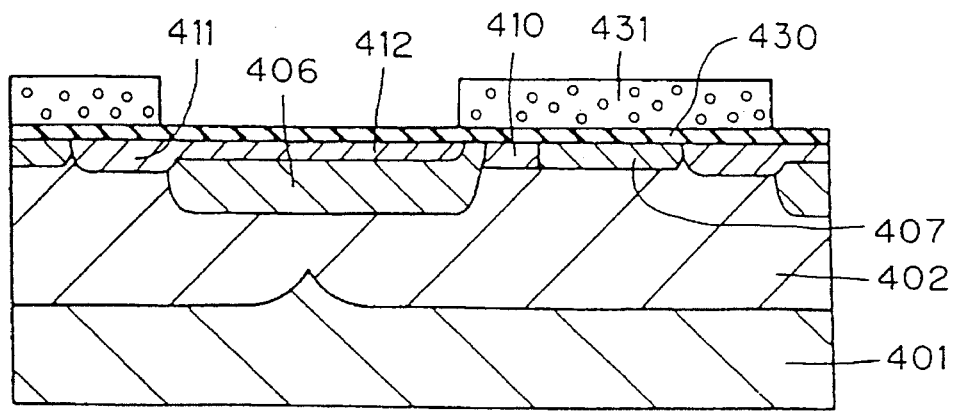

With reference to FIG. 5E, the fourth photo-resist pattern 420d is completely removed and subsequently the side walls 413 are completely removed by a wet etching which uses a fluorate. The tungsten film 408 is further removed by a wet etching which uses a H$_2$O$_2$ liquid. Furthermore, the polycrystalline silicon film 404 and the thin silicon oxide film 403 are sequentially removed by a wet etching. A thermal oxidation is accomplished to form a first gate oxide film which is not illustrated. Subsequently, a first charge transfer electrode which is not illustrated is formed by uses of a low pressure chemical vapor deposition method, a photo-lithography method and a plasma etching method. The first charge transfer electrode serves to conduct the charge transfer. The first gate oxide film is selectively removed by an etching in which the first charge transfer electrode is used as a mask. An additional thermal oxidation is accomplished to form a second gate oxide film 430 on an entire top surface of the device. Subsequently, a second charge transfer electrode 431 is formed by use of the low pressure chemical vapor deposition method, the photo-lithography method and the plasma etching method. The second charge transfer electrode 431 serves to conduct both a read operation of a signal charge and a charge transfer from the opto-electro conversion region 406 to the charge transfer region 407. A further ion-implantation of a p-type dopant such as boron is accomplished with use of the second charge transfer electrode 431 as a mask to form a p$^+$-type shallow region 412 over the opto-electro conversion region 406. The p-type dopant is implanted at such an energy as to enable the p-type dopant to penetrate through the second gate oxide film 430 and implanted into an upper portion of the n-type opto-electro conversion region 406. The above further ion-implantation is continued until the above upper portion thereof implanted with the p-type dopant is made into the p$^+$-type shallow region.

Figure 5F:
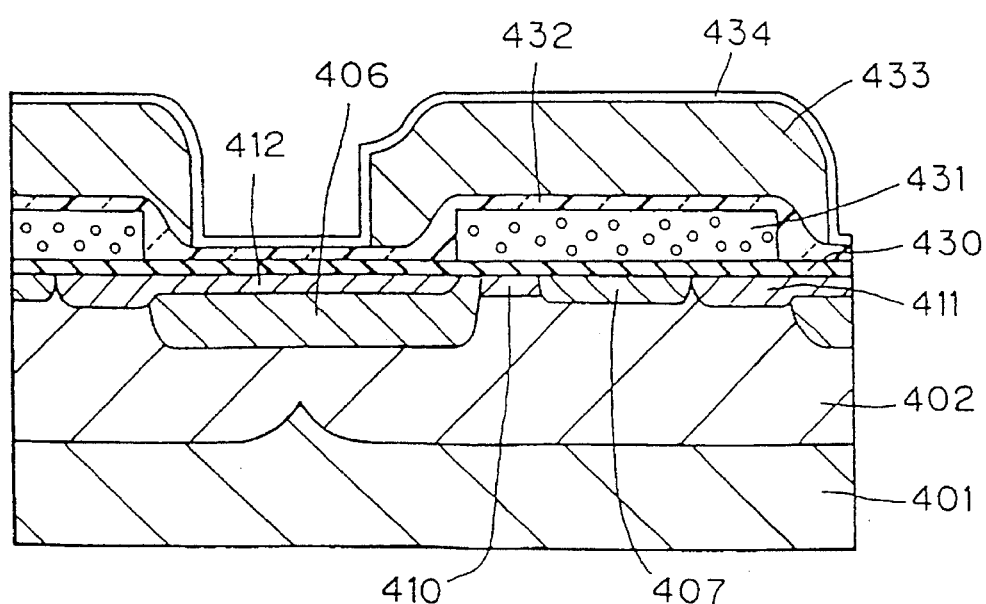

With reference to FIG. 5F, an inter-layer insulator 432 is deposited to cover both the second charge transfer electrode 431 and an exposed portion of the second gate oxide film 430. A contact hole which is not illustrated is formed in the inter-layer insulator 432 so that a part of the second charge transfer electrode 431 is exposed through the contact hole. A metal film 433 to serve not only as a wiring but also as a photo mask is selectively formed on part of the inter-layer insulator 432 over the charge transfer electrode 431. A protective silicon oxide film 434 is formed on an entire surface of the device to cover both the metal film 433 and an exposed surface of the inter-layer insulator 432 thereby the fabrication processes for the solid state imaging device according to the present invention are completed.

The above novel fabrication processes has advantages in the following matters. In the fabrication step as illustrated in FIG. 5D, the p$^+$-type isolation region 411 is so formed as to be separated from the n-type active regions such as the opto-electro conversion region 406 and the charge transfer region 407. Such a separation between the p$^+$-type isolation region and the n-type active regions is able to prevent the p-type dopant in the p$^+$-type isolation region to be moved into the n-type active regions even if the p$^+$-type isolation region 411 is subjected to a heat treatment and shows a lateral diffusion. The above novel fabrication method is able to suppress any decrement of the active regions such as the n-type opto-electro conversion region 406 and the n-type charge transfer region 407.

Further, the above sequential fabrication processes includes none of any thermal oxidation for forming a thick silicon oxide film on any active regions or the n-type charge transfer region 407 and the n-type opto-electro conversion region 406. Then, the active regions or the n-type charge transfer region 407 and the n-type opto-electro conversion region 406 neither receive any damage due to such a heat treatment as the thermal oxidation to form the thick silicon oxide film nor includes any crystal defect. None of such a heat treatment as the thermal oxidation process influential against any active regions or the n-type charge transfer region 107 and the n-type opto-electro conversion region 406 is able to suppress any appearance of dislocations such as the dislocation loop in its lattice structure. This allows a perfection of the crystal or lattice structure of the active region or the n-type charge transfer region 407. None of the heat treatment such as the thermal oxidation process influential against either the n-type charge transfer region 407 or the n-type opto-electro conversion region 406 is further able to suppress any variation of an impurity concentration profile for the active regions or the n-type charge transfer region 407 and the n-type opto-electro conversion region 406. Those permit the resultant solid state imaging device to possess or show excellent properties and performances.

From the above detailed descriptions, it could be appreciated that the above novel fabrication method of the first embodiment according to the present invention is applicable to various types of charge transfer devices such as a surface channel charge transfer device, although any illustration and description thereof are omitted. Similarly, the above novel fabrication methods of the second to fourth embodiments according to the present invention are also applicable to various types of solid state imaging devices such as either an area type solid state imaging device or a linear type solid state imaging device. Although in the above embodiments the tungsten film or the aluminium film is formed by the chemical vapor deposition method, various metal films for example a molybdenum film are available to match various conditions. Needless to say, various conditions in the fabrication processes are changeable.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by the claims any modifications of the present invention which fall within the sprit and scope of the present invention.

What is claimed is :

1. A method for fabricating an isolation region involved in a semiconductor device comprising the steps of:

forming an active region of a first conductivity type in an area in a semiconductor layer of a second conductivity type;

forming a metal film over said active region without subjecting said active region to a heat treatment to prevent said active region from suffering any damage due to said heat treatment;

forming side walls at opposite sides of said metal film, said side walls being used as a first mask together with said metal film for said formation of said isolation region so that said isolation region is separated from said active region; and carrying out an ion-implantation of an impurity of the second conductivity type using said metal film as a second mask for a formation of an isolation region of a higher impurity concentration than an impurity concentration of said second conductivity type semiconductor layer.

2. The method as claimed in claim 1, further comprising the steps of:

forming a first silicon oxide film on an entire surface of said second conductivity type semiconductor layer;

forming a polycrystalline silicon film on said first silicon oxide film;

forming a second silicon oxide film having a thickness greater than a thickness of said first silicon oxide film on said polycrystalline silicon film so than said second silicon oxide film is used as a third mask for an ion-implantation of the impurity of the first conductivity type to form said active region and for subsequently forming said metal film; and removing said second silicon oxide film prior to said formation of said isolation region.

3. The method as claimed in claim 1, wherein said metal film is formed by a chemical vapor deposition method.

4. The method as claimed in claim 1, wherein said metal film comprises a tungsten film.

5. The method as claimed in claim 1, wherein said metal film comprises an aluminium film.

6. The method as claimed in claim 1, wherein said metal film comprises a molybdenum film.

7. A method for fabricating a semiconductor device involving an isolation region comprising the steps of:

forming a first silicon oxide film on a semiconductor substrate of a first conductivity type;

forming a polycrystalline silicon film on said first silicon oxide film;

forming a second silicon oxide film having a thickness greater than a thickness of said first silicon oxide film on said polycrystalline silicon film;

forming an active region by an ion-implantation of an impurity of a second conductivity type into said semiconductor substrate using said second silicon oxide film as a first mask;

forming a metal film on said polycrystalline silicon film by a chemical vapor deposition using said first mask so that said metal film is positioned over said active region;

removing said second silicon oxide film;

carrying out an ion-implantation of an impurity of the first conductivity type using said metal film as a second mask to form an isolation region of a higher impurity concentration than an impurity concentration of said semiconductor substrate;

removing said metal film, said polycrystalline silicon film and said first silicon oxide film;

forming an insulation film on said active region and said isolation region; and forming an electrode on said insulation film, thereby the semiconductor device is so fabricated as to prevent said active region from receiving any heat treatment during said method.

8. The method as claimed in claim 7, wherein said metal film comprises a tungsten film.

9. The method as claimed in claim 7, wherein said metal film comprises an aluminium film.

10. The method as claimed in claim 7, wherein said metal film comprises a molybdenum film.

11. The method as claimed in claim 9, wherein said first silicon oxide film has a thickness of approximately 20 nanometers; and said first silicon oxide film has a thickness of approximately 300 nanometers.

12. The method as claimed in claim 7, wherein:

said active region serves as a charge transfer region;

said electrode serves as a charge transfer electrode; and said semiconductor device serves as a charge transfer device.

13. The method as claimed in claim 7, wherein said first and second conductivity type impurities are phosphorus and boron respectively.

14. The method as claimed in claim 7, wherein said polycrystalline silicon film has a thickness of approximately 100 nanometers.

15. The method as claimed in claim 7, further comprising the step of:

forming side walls at opposite sides of said metal film to be used as a third mask together with said metal film for said formation of said isolation region so that said isolation region is formed to be separated from said active regions.

16. The method as claimed in claim 15, wherein said side walls are formed by an anisotropic etching.

17. A method for fabricating a semiconductor device involving an isolation region comprising the steps of:

forming a well region of a first conductivity type on a semiconductor substrate of a second conductivity type;

forming a first silicon oxide film on said well region;

forming a polycrystalline silicon film on said first silicon oxide film;

forming a second silicon oxide film having a thickness greater than a thickness of the first silicon oxide film on said polycrystalline silicon film;

forming first and second active regions by an ion-implantation of an impurity of the second conductivity type using said second silicon oxide film as a first mask and first photo-resist patterns as second masks;

removing said first photo-resist patterns;

forming a metal film on said polycrystalline silicon film by a chemical vapor deposition using said first mask so that said metal film is positioned over said first and second active regions;

removing said second silicon oxide film;

carrying out a first ion-implantation of an impurity of the first conductivity type using said metal film as a third mask to form regions of the first conductivity type having a higher impurity concentration than an impurity concentration of said well region;

providing a second photo-resist pattern on said polycrystalline silicon film, except over an area in said regions of said first conductivity type;

carrying out a second ion-implantation of an impurity of the first conductivity type using both said third mask and said second photo-resist pattern as a fourth mask for a formation of an isolation region of the first conductivity type having a higher impurity concentration than an impurity concentration of said first conductivity type region;

removing said second photo-resist pattern, said metal film, said polycrystalline silicon film and said first silicon oxide film;

forming an insulation film having a contact hole on said first and second active regions, said regions of said first conductivity type and said isolation region; and forming an electrode on said insulation film over at least one of said first and second active regions, said electrode being electrically coupled through said contact hole to said at least one of said first and second active regions;

forming an inter-layer insulator on an entire surface of the device to cover at least said electrode, said inter-layer insulator comprising an opening aligned with said contact hole;

forming a metal layer on said inter-layer insulator, said metal layer being electrically coupled through said contact hole to said electrode.

18. The method as claimed in claim 17, further comprising the step of :

forming side walls at opposite sides of said metal film to be used as a fourth mask together with said metal film for said formation of said isolation region so that said isolation region is formed to be separated from said active regions.

19. The method as claimed in claim 18, wherein said side walls are formed by an anisotropic etching.

20. The method as claimed in claim 17, further comprising the step of:

forming a region of the second conductivity type on said first active region by an ion-implantation of an impurity of the first conductivity type into an upper region of said first active region using said electrode as a fifth mask in which said electrode is not positioned over said first active region.

21. The method as claimed in claim 17, further comprising the step of:

forming a protective insulating film on an entire surface of the device to cover at least said metal layer.

22. The method as claimed in claim 17, wherein said metal film comprises a tungsten film.

23. The method as claimed in claim 17, wherein said metal film comprises an aluminium film.

24. The method as claimed in claim 17, wherein said metal film comprises a molybdenum film.

25. The method as claimed in claim 17, wherein:

said first active region serves as an opto-electro conversion region;

said second active region serves as a charge transfer region;

said electrode serves as a charge transfer electrode; and said semiconductor device serves as a solid state imaging device.

26. The method as claimed in claim 17, wherein said first and second conductivity type impurities are phosphorus and boron respectively.

* * * * *